United States Patent
Chen et al.

(10) Patent No.: US 7,684,608 B2
(45) Date of Patent: Mar. 23, 2010

(54) TAPE AND REEL INSPECTION SYSTEM

(75) Inventors: Zhaoxi Chen, Plano, TX (US); Kuen-Yu Liu, Plano, TX (US); Fang Yang, Plano, TX (US); Song Yang, Allen, TX (US)

(73) Assignee: Vistech Corporation, Richardson, TX (US)

( * ) Notice: Subject to any disclaimer, the term of this patent is extended or adjusted under 35 U.S.C. 154(b) by 1065 days.

(21) Appl. No.: 11/360,829

(22) Filed: Feb. 23, 2006

(65) Prior Publication Data

US 2007/0196010 A1 Aug. 23, 2007

(51) Int. Cl.
*G06K 9/00* (2006.01)
*G01R 31/26* (2006.01)

(52) U.S. Cl. .................. 382/141; 382/103; 382/181; 438/14

(58) Field of Classification Search .............. 382/100, 382/103, 141–153, 181, 209, 217–220; 438/14
See application file for complete search history.

(56) References Cited

U.S. PATENT DOCUMENTS

| | | | | |
|---|---|---|---|---|
| 3,127,273 A * | 3/1964 | Monahan | .................. | 53/442 |
| 4,510,673 A * | 4/1985 | Shils et al. | .................. | 438/15 |
| 4,610,083 A * | 9/1986 | Campisi et al. | .................. | 29/832 |
| 4,776,747 A * | 10/1988 | Swapp et al. | ............ | 414/416.09 |
| 5,307,011 A * | 4/1994 | Tani | .................. | 324/158.1 |
| 5,313,156 A * | 5/1994 | Klug et al. | ................. | 324/158.1 |
| 5,347,463 A * | 9/1994 | Nakamura et al. | .......... | 700/226 |
| 5,350,715 A * | 9/1994 | Lee | .............. | 438/16 |
| 5,419,802 A * | 5/1995 | Nakatsuka et al. | .......... | 156/584 |
| 5,448,488 A * | 9/1995 | Oshima | .................. | 700/121 |
| 5,562,384 A * | 10/1996 | Alvite et al. | ........... | 414/226.01 |
| 5,625,287 A * | 4/1997 | Nakamura et al. | ........ | 324/158.1 |
| 5,694,443 A * | 12/1997 | Stone et al. | .................. | 377/6 |
| 5,729,963 A * | 3/1998 | Bird | .................. | 53/471 |
| 5,801,067 A * | 9/1998 | Shaw et al. | ................... | 438/15 |
| 5,805,472 A * | 9/1998 | Fukasawa | ................... | 702/118 |
| 5,890,807 A * | 4/1999 | Igel et al. | .................. | 382/100 |
| 5,894,218 A * | 4/1999 | Farnworth et al. | ........ | 324/158.1 |
| 6,049,624 A * | 4/2000 | Wilson et al. | ............... | 382/145 |
| 6,075,358 A * | 6/2000 | Hetzel et al. | ............ | 324/158.1 |
| 6,155,025 A * | 12/2000 | Komiya et al. | ................. | 53/147 |
| 6,314,332 B1 * | 11/2001 | Kida | .................. | 700/113 |
| 6,332,536 B2 * | 12/2001 | Easton | ................... | 206/459.5 |
| 7,138,629 B2 * | 11/2006 | Noji et al. | .................... | 250/311 |
| 7,445,944 B2 * | 11/2008 | Tong et al. | ...................... | 438/4 |

(Continued)

*Primary Examiner*—Manav Seth

(57) ABSTRACT

A tape and reel inspection system is provided with OCR testing of devices, network retrieval of device lot information, and automatic teaching of image patterns. Each device lot is typically accompanied by a travel sheet, which includes a history for the device lot. The travel sheet may include a bar code to allow the system to receive the device lot number while reducing the possibility of human error. The system performs OCR on a first device. The system communicates with a database to obtain lot information. The system combines lot information and package information to form marking information. The system then compares the contents of the markings with line information obtained from the marking information. Once a first device passes the OCR test, the system trains an image of the first device. Image training may be done automatically without intervention from the operator. If a subsequent device fails the image test, the inspection system automatically performs OCR on the failed device.

30 Claims, 18 Drawing Sheets

U.S. PATENT DOCUMENTS

| | | | |
|---|---|---|---|
| 7,479,980 B2 * | 1/2009 | Merheim et al. | 348/152 |
| 7,547,575 B2 * | 6/2009 | Tong et al. | 438/107 |
| 2002/0092910 A1 * | 7/2002 | Lim et al. | 235/462.13 |
| 2005/0150192 A1 * | 7/2005 | Armington et al. | 53/472 |
| 2006/0207089 A1 * | 9/2006 | Maenishi et al. | 29/832 |
| 2007/0086644 A1 * | 4/2007 | Wilson et al. | 382/145 |
| 2007/0150092 A1 * | 6/2007 | Ohmura et al. | 700/231 |
| 2008/0035520 A1 * | 2/2008 | Caracciolo et al. | 206/531 |
| 2008/0190953 A1 * | 8/2008 | Mallett et al. | 221/13 |
| 2008/0195247 A1 * | 8/2008 | Mallett et al. | 700/225 |

* cited by examiner

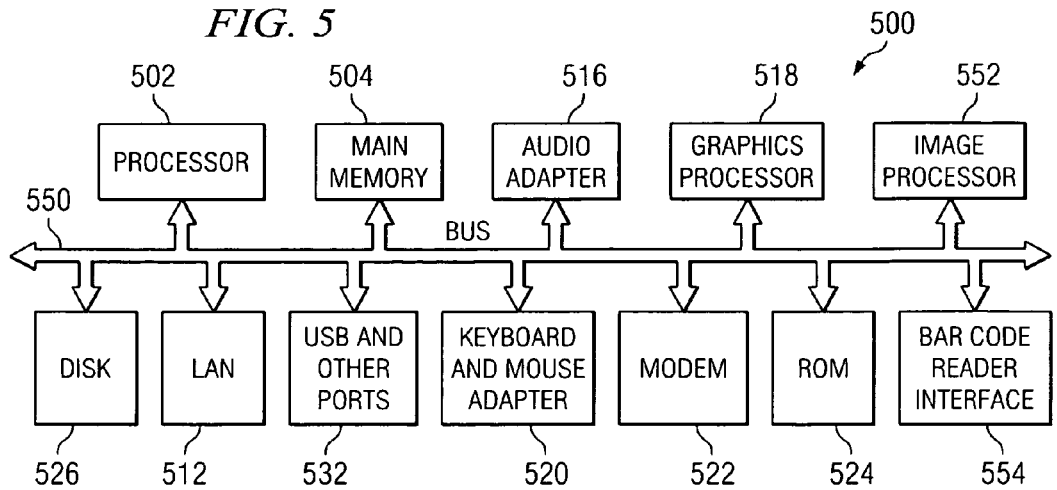

```
###################################
#   Package Information File

#   Format Explanation:

#   Feature: Example (Case sensitive) → Rules and Explanations
#----------------------------------------------------------------

#     PACKAGE_NAME: DGG48      Package name.
#                              Package name must be identical to the one use din lot
#                              information file

#     PIN_NUMBER: 48           Total lead number on the device
#                              You can leave this blank, if you don't know.

#     LINE1: YM      "K"   1   The 1st marking line
#            |       |     +--→ Tells if do OCR or not on the line
#            |       |            0 - Do NOT do OCR on the line
#            |       |            1 - Do OCR on the line. Reject the device if OCR fails.
#            |       |           -1 = Do OCR, display warning message if OCR fails.
#            |       |            2 = Do OCR only on some chars on the line.
#            |       |              If this number is 2, there should be 2 more numbers
#            |       |              after this.
#            |       |              The 1st number is OCR start char; the 2nd is OCR total
#            |       |              chars.
#            |       |              (Please use LINE2 below for an example.)
#            |       +-----→ Symbol String. It's a real value.
#            +-----------→ Symbol Code.
#                              1. Symbol Code is used for looking up the real value in lot
#                                 information file.
#                              2. Symbol Code cannot be empty!

#     LINE2: LLLL  2  3  2     The 2nd marking line. You can increase line number
#                  |  |  |     and add more marking lines.
#                  |  |  +--→ OCR total chars is 2.
#                  |  +-----→ Do OCR start from 3rd char. (Skip the 1st, 2nd chars).
#                  |           Example: The line name is 85236. We do OCR only on 23.
#                  +--------→ Do OCR only on some chars this line.

#     LINE3: DEVICENAME   1    The 3rd marking line. You can increase line number
#                              and add more marking lines.

...
```

*FIG. 7A-1*

```
#    LOGO1: -1    B    LOGO    The 1st Logo.
#           |     |     |      If there is no logo at all, this line will not appear.
#           |     |     +--►   Logo Symbol Code
#           |     |              1. Logo Symbol Code is used for looking up the real value
#           |     |                 in lot information file
#           |     |              2. Logo Symbol Code cannot be empty!
#           |     +-----►      Logo Location
#           |                    B - Beginning of the line.
#           |                    E - End of the line.
#           |                    W - The whole line is a logo.
#           +---------►         Line position of the logo.
#                                 The line number is based on marking lines.
#                                    -1 - two lines before the first marking line
#                                     0 - one line before the first marking line
#                                     1 - on the first marking line
#                                     2 - on the second marking line
#                                     3 - one line after the last marking line
#                                     4 - two lines after the last marking line
#    LOGO2: 0     W    "T"     Second Logo.
#                       |      You can increase line number and add more logos.
#                       +--►   Logo string. It's a real value.
#                              The number of characters input here should be the same as
#                              the number of object (blob) on logo area on real device.
#    ORIENTATION:      0       Defines the orientation of the marking.
#                      +---►   The orientation value could be:
#                                 0 = no rotation.
#                                 270 = marking is rotated 270 degrees clockwise.
#                                 This orientation is used by MARQ-NT software when
#                                 "Use only 2 package types when auto change" is activated
#                                 in Config, Run Control, Special Tab.

################################################
```

*FIG. 7A-2*

Dummy For Demo
PAKAGE_NAME: ONS_MFP16L_200MIL_TR2000
PIN_NUMBER: 16
LINE1: Line1         1
LINE2: Line2         1

PACKAGE_NAME: MOT_LFBGA81_8X8X1.3P0.8B16
PIN_NUMBER: 16
LINE1: Line1         1
LINE2: Line2         1
LINE3: Line3         1
LINE4: Line4         1

PAKAGE_NAME: ONS_MFP14L_200MIL_TR2000
PIN_NUMBER: 14
LINE1: Line1         1
LINE2: Line2         1

PAKAGE_NAME: ONS_MFP16L_200MIL_PB_TR2000
PIN_NUMBER: 16
LINE1: Line1         1
LINE2: Line2         1

PAKAGE_NAME: ONS_MFP14L_200MIL_PB_TR2000
PIN_NUMBER: 14
LINE1: Line1         1
LINE2: Line2         1

*FIG. 7B*

```
[AO]
Number=P525XJ0MZ0

[JOB]
Filename=ONS_MFP14L_200MIL_TR2000

[COMBINE_LINE]
Index=Line-1

[LOT_INFO]
Total_Lot-2

[TOP_SIDE_MARKING]
Lot_Number=P525XJ0MZ0
Line1=74HC08A
Line2=XAFM

Lot_Number=P525XJ0MRZ
Line1=74HC08A
Line2=XAFM

[BACK_SIDE_MARKING]
Lot_Number=P525XJ0MZ0

Lot_Number=P525XJ0MRZ

[LOT INFO END]
37858
```

*FIG. 8*

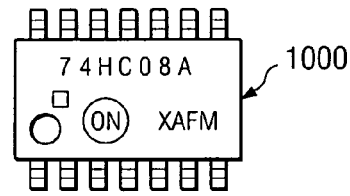

*FIG. 10A*

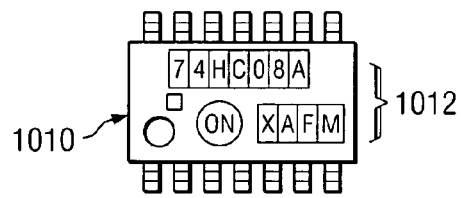

*FIG. 10B*

```
CUSTOMER:        ASE
LOT:        P525XJ0MZ0
PACKAGE_NAME:    ONS_MFP14L_200MIL_TR2000
TOTAL_LINE:      2
LINE1:  74HC08A     1
LINE2:  XAFM        1
TOTAL_LOGO:        0
PARTNAME_DEVICENAME_DEVICETYPE:    74HC08A
```

*FIG. 9*

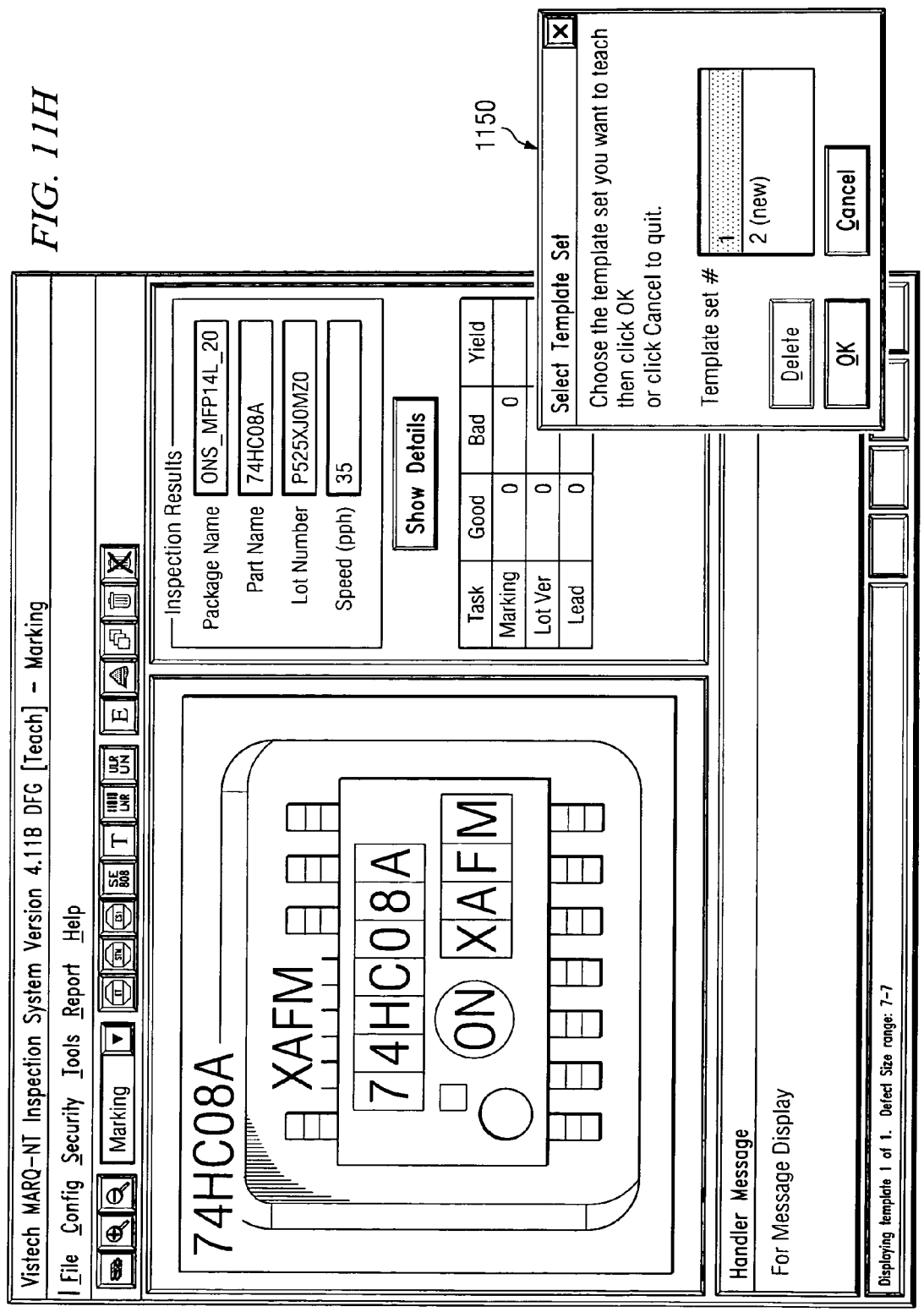

TAPE AND REEL INSPECTION SYSTEM

BACKGROUND OF THE INVENTION

1. Field of the Invention

The present invention relates generally to packaging semiconductor devices for mass manufacture of electronic devices and, in particular, to packaging semiconductor devices using tape and reel packaging. Still more particularly, the present invention relates to machine vision and automatic inspection of markings on semiconductor devices in a tape and reel inspection system.

2. Description of the Related Art

Manufacture of electronic devices involves a good amount of automation. Circuit boards move along an assembly line, a robotic mechanism places the chips onto the boards, and the chips are attached to the circuit boards by passing the circuit boards over a pool of hot solder. As the solder cools, it bonds with the metal on the circuit board and the pins of the chips.

Due to the speed of the manufacturing process, manufacturers must provide a large number of chips to the automated equipment. For example, a graphics card may have several memory chips, each having the same size and number of pins. After chips are fabricated, they may be placed in several different containers, such as tubes or trays.

Another type of container is a tape and reel. Often, semiconductor devices, or chips, are placed into a carrier tape, which is a strip of plastic with pockets—each chip is placed into a pocket. As the carrier tape is wound onto a reel, a cover tape is sealed over the carrier tape. A reel may hold as many as 5000 chips, or possibly more. A reel may then be provided to automated manufacturing equipment, which then takes the chips from the tape and places them onto circuit boards.

It is important that all of the chips on a reel are, in fact, the same device. However, the possibility of mixing devices is significant. Many vastly different devices have the same die size and number of pins. A human operator can easily confuse two different chips. Also, each chip has a small area to mark a part number, and the part numbers may be very similar.

Tape and reeler inspection stations have been introduced to inspect the markings on chips as they are placed into the carrier tape. Tape and reeler inspection stations have machine vision systems, which use image pattern matching to ensure that every chip on a reel is the correct device. A human operator trains the system. Thus, tape and reeler inspection stations are susceptible to human error.

SUMMARY OF THE INVENTION

The present invention recognizes the disadvantages of prior art tape and reel inspection stations and provides a tape and reel inspection station. A picking/placing mechanism receives a plurality of devices and places the plurality of devices on a tape and reel. A camera receives an image of each device being placed on the tape and reel. An inspection system is operatively coupled to the picking/placing mechanism and the camera. The inspection system is configured to receive an identification of a device lot. The device lot comprises the plurality of devices to be packaged in the tape and reel. The inspection system is configured to retrieve device lot information for the device lot using the identification of the device lot. The inspection system is configured to perform an optical character recognition test on a first device in the plurality of devices based on the device lot information and train an image of the first device received from the camera to form a trained image responsive to the first device passing the optical character recognition test. The inspection system is configured to then perform an image test on subsequent devices in the plurality of devices based on the trained image.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 is an exemplary functional block diagram of a tape reeler inspection system in accordance with exemplary aspects of the present invention;

FIG. 6 illustrates an example of a travel sheet in accordance with exemplary aspects of the present invention;

FIGS. 7A-1, 7A-2 and 7B illustrate an example of a package information file in accordance with exemplary aspects of the present invention;

FIG. 8 illustrates an example of a device lot information file received from a factory mainframe in accordance with exemplary aspects of the present invention;

FIG. 9 depicts an example of device marking information that is generated based on the lot information file and the package information file in accordance with exemplary aspects of the present invention;

FIGS. 10A and 10B illustrate examples of images captured by a camera of a tape reeler inspection system in accordance with exemplary aspects of the present invention;

FIGS. 11A-11H illustrate example display screens for a graphical user interface of a tape reeler inspection system in accordance with exemplary aspects of the present invention;

DETAILED DESCRIPTION OF THE PREFERRED EMBODIMENT

Figure 1:
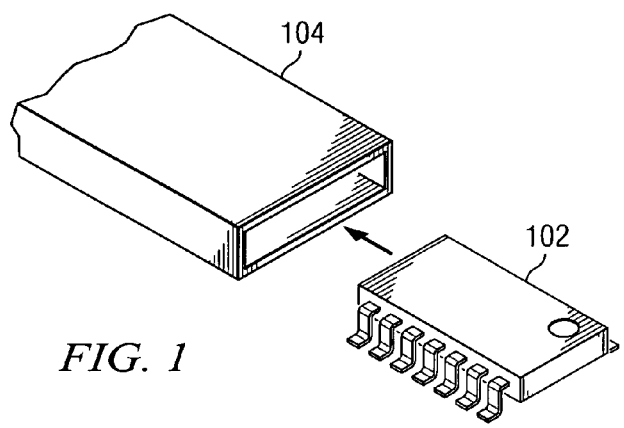
FIG. 1 illustrates tube packaging for semiconductor devices.

With reference now to the figures, FIG. 1 illustrates tube packaging for semiconductor devices. Chip 102 is a semiconductor device. Chip 102 is inserted into an end of tube 104. When tube 104 is full, both ends are sealed. Tube 104 may then be a source of semiconductor devices for a tape and reel system in accordance with exemplary aspects of the present invention.

Figure 2:
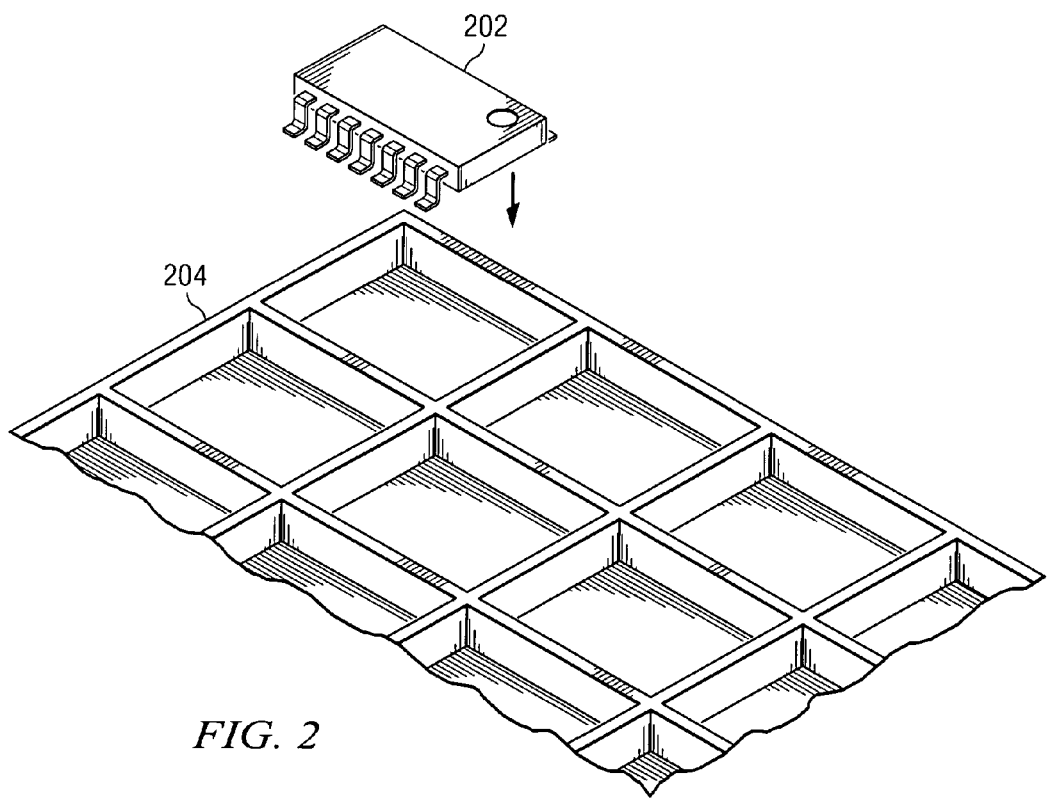
FIG. 2 illustrates tray packaging for semiconductor devices.

FIG. 2 illustrates tray packaging for semiconductor devices. Chip 202 is placed into a pocket of tray 204. When tray 204 is full, a cover is applied. Tray 204 is another example of a source of semiconductor devices for a tape and reel system in accordance with exemplary aspects of the present invention.

Figure 3A:
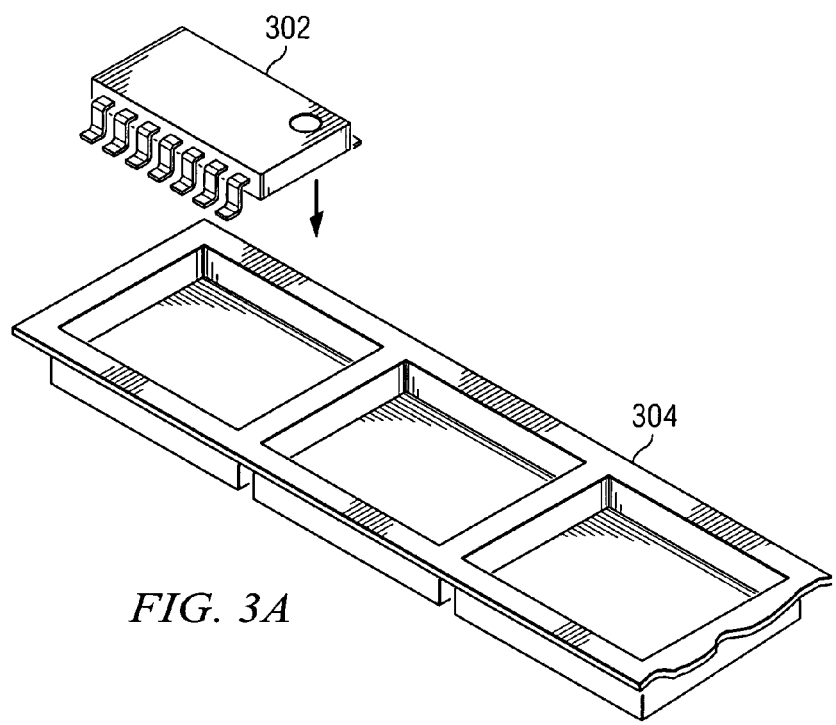
FIGS. 3A and 3B illustrate tape and reel packaging for semiconductor devices in accordance with exemplary aspects of the present invention.
Figure 3B:
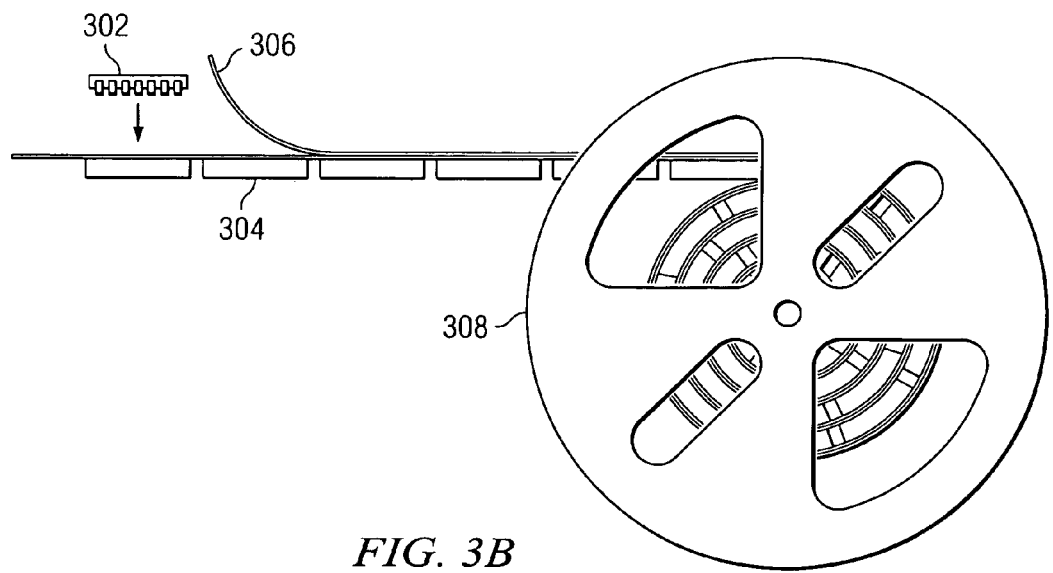

FIGS. 3A and 3B illustrate tape and reel packaging for semiconductor devices in accordance with exemplary aspects of the present invention. More particularly, with reference to FIG. 3A, chip 302 is placed into a pocket of carrier tape 304. Chip 302 may be selected from a source container, such as tube 104 in FIG. 1 or tray 204 in FIG. 2. A robotic picking/placing mechanism, for example, may pick a chip from a source container and place the chip in a pocket of tape 304.

Turning to FIG. 3B, as carrier tape 304 is wound onto reel 308, cover tape 306 is placed onto carrier tape 304, sealing the chips into the pockets of carrier tape 304. Cover tape 306 may have an adhesive and may be affixed to carrier tape 304 using pressure. In an alternative embodiment, carrier tape 304 may have an adhesive. As a further exemplary embodiment, cover tape 306 may be affixed to carrier tape 304 by heating cover tape 306 and/or carrier tape 304. Other techniques for affixing cover tape 306 to carrier tape 304 will become readily apparent to those of ordinary skill in the art.

Figure 4:
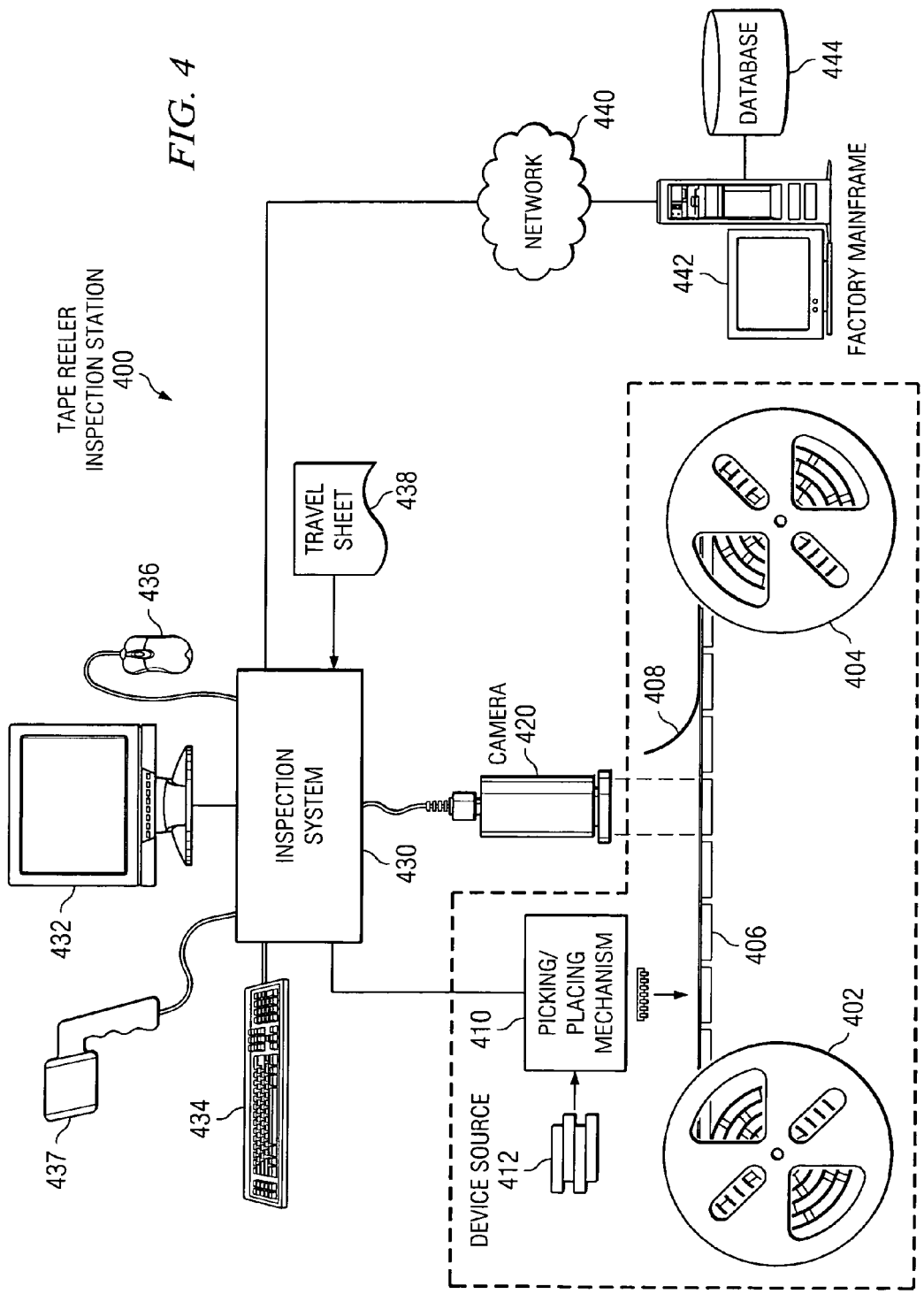
FIG. 4 is a diagram depicting a tape reeler inspection station in accordance with exemplary aspects of the present invention.

With reference now to FIG. 4, a diagram depicting a tape reeler inspection station is shown in accordance with exemplary aspects of the present invention. Tape reeler inspection station 400 receives semiconductor devise, or chips, from device source 412. As mentioned above, device source 412 may comprise tubes or trays, although any source of devices may be used. For example, semiconductor devices may be selected from bins or boxes of devices.

Device source 412 may comprise, for example, a number of devices that are to be packaged on the same reel. This group of devices is referred to as a "lot"; however, to avoid confusion, a group of devices will be referred to herein as a "device lot." It is an object of tape reeler inspection station 400 to place all of the devices from the same device lot onto the same reel. If devices from different device lots are placed on the same reel, this is called a mixed device. Mixed devices cause many problems for manufacturers. In fact, automated manufacturing equipment will likely place the incorrect devices blindly onto a circuit board, which will most certainly result in a defective product.

Supply reel 402 provides carrier tape 406 to tape reeler inspection station 400. Carrier tape 406 is wound onto take-up reel 404. Picking/placing mechanism 410 picks chips from device source 412 and places the devices into pockets of carrier tape 406 as carrier tape moves from supply reel 402 to take-up reel 404. One or more servos or motors (not shown) may be used to move carrier tape 406 from supply reel 402 to take-up reel 404 at a constant speed. As carrier tape 406 is provided to take-up reel 404, a sealing device (not shown) seals cover tape 408 onto carrier tape 406.

Before a device is sealed into its pocket, camera 420 captures an image of the device and provides the image to inspection system 430. An operator controls the operation tape reeler inspection station 400 using an input device, such as keyboard 434, mouse 436, or bar code reader 437. The operator is able to view images provided by camera 420 and control operation through a graphical user interface that is presented on display 432.

According to exemplary aspects of the present invention, an operator inspects a first device by viewing an image provided by camera 420, as the image is presented on display 432. The operator may simply inspect the markings on the device to determine whether the device is correct. If the device is correct, the operator teaches inspection system 430 by selecting the portion of the image that includes the markings.

Once trained, inspection system 430 obtains an image of each device as it passes to take-up reel 404. Inspection system 430 then performs pattern matching to determine if the image of the device matches the trained image. If a predetermined number of consecutive devices fail the pattern matching, the operator is notified. The operator must then intervene and determine whether the device is indeed an incorrect device. If the device is incorrect, the operator must resolve the problem. Otherwise, if the device is correct, the operator must retrain inspection system 430.

While this inspection procedure eliminates many of the problems associated with mixed devices, the procedure is still dependent upon a human operator and, thus, is susceptible to human error. Therefore, inspection system 430 performs optical character recognition (OCR) on the first device when the operator trains the device. The operator may provide line information for the markings of a device. Inspection system 430 determines the contents of the markings based on OCR and the line information entered by the operator.

Again, this inspection procedure relies on the operator entering line information. If the operator enters incorrect line information for the device lot and then trains inspection system 430 with the image of an incorrect device, then a mixed device may occur.

Therefore, in accordance with exemplary aspects of the present invention, inspection station 430 reads a device lot number or other identifier from travel sheet 438. Each device lot is typically accompanied by a travel sheet, which includes a history for the device lot. An example of a travel sheet is shown in FIG. 6, which will be described in further detail below. Travel sheet 438 may include a bar code, for example, to allow inspection system 430 to receive the device lot number or other identifier, while reducing the possibility of human error. The operator may read the bar code using bar code reader 437.

After inspection station 430 reads the device lot number or other identifier from travel sheet 438, inspection station 430 communicates with factory mainframe 442 via network 440 to obtain device lot information. Network 440 is a medium used to provide communications links between various devices and computers connected together, particularly, inspection system 430 and factory mainframe 442. Network 440 may include connections, such as wire, wireless communication links, or fiber optic cables.

In the depicted example, factory mainframe 442 connects to network 440 and database 444, which stores device lot information. Factory mainframe 442 provides access to data, more specifically device lot information from database 444. Inspection system 430 is a client to factory mainframe 442 in this example.

Network 440 may be the Internet with network 440 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, network 440 also may be implemented as a number of different types of networks, such as for example, an intranet, a local area network (LAN), or a wide area network (WAN).

Factory mainframe 442 and database 444 may exist in the same location as inspection system 430. For instance, tape reeler inspection station 400 may be owned and/or operated by the manufacturer of the semiconductor devices. Alternatively, factory mainframe 442 and database 444 may be located remotely from inspection system 430. For example, the semiconductor device manufacturer may have multiple site locations, and devices may be sent to a different site to be transferred to tape and reel. As another example, the semiconductor device manufacturer may hire another party to transfer devices to tape and reel. As a further example, tape reeler inspection station 400 may be owned and/or operated by an electronics device manufacturer.

The device lot information obtained from factory mainframe 442 includes information describing the number of lines of characters, the orientation of the characters, the location of company logos, and the like. From this information, inspection system 430 can perform OCR on a device without intervention from a human user.

Once a first device is tested with OCR, if the first device passes the OCR test, inspection system 430 then trains an image of the first device. The image training may be performed by the operator. In one exemplary embodiment, inspection system 430 may use image analysis techniques to recognize and train the image of the markings on the chip. Using this trained image, inspection system 430 then performs an image test on the remaining devices.

If a subsequent device fails the image test, inspection system 430 may automatically perform OCR on the failed device. If the device passes the OCR test based on the device marking information, inspection station 430 may then retrain the image of the markings of the chip. If however, the device is from another lot, then inspection system 430 stops. The operator scans a new bar code using bar code reader 437. If it is a combined lot with a combined lot travel sheet that has been scanned, and the device name on the combined lot is the same as the device name on the previous lot, then the device will pass the combined lot test and, thus, the OCR test. This inspection procedure greatly reduces the amount of human intervention and, hence, the likelihood for human error. Alternatively, inspection system 430 may alert the operator to manually examine the device markings, especially if the device fails the OCR test multiple times.

In accordance with one exemplary embodiment, devices may be taken from a combination of lots within device source 412. For example, the same device, with the same specifications, may be manufactured in different locations or even by different manufacturers. Thus, the markings on the devices may be different, even though the devices are functionally the same. In some cases, one may disallow combined lots. For example, the devices may be the same; however, devices from a certain manufacturer or a certain factory may have more defective units. On the other hand, one may allow combined lots. Thus, the OCR test applied by inspection system 430 may include the application of a combined lot rule, which determines whether certain sets or patterns of markings pass the OCR test.

FIG. 5 is an exemplary functional block diagram of a tape reeler inspection system in accordance with exemplary aspects of the present invention. The elements of the functional block diagram of FIG. 5 may be implemented as hardware, software, or a combination of hardware and software components. In one exemplary embodiment, the functional elements shown in FIG. 5 are implemented as software instructions executed by a special purpose computer system.

As shown in FIG. 5, tape reeler inspection system 500 includes processor 502, main memory 504, audio adapter 516, graphics adapter 518, disk storage device 526, network adapter 512, USB and other ports such as input/output (I/O) ports 532, keyboard and mouse adapter 520, modem 522, read-only memory 524, image processor 552, and bar code reader interface 554. These elements are in communication with one another via bus 550. Although a bus architecture is shown in FIG. 5, the exemplary embodiments described herein are not limited to such and any architecture allowing for the communication of control messages and data between the elements 502-524, 552, and 554 may be used without departing from the spirit and scope of the present invention.

Processor 502 controls the overall operation of the tape reeler inspection system. Graphics processor 518 may be connected to bus 550 through an accelerated graphics port (AGP). ROM 524 may be, for example, a flash binary input/output system (BIOS). HDD 526 may use, for example, an integrated drive electronics (IDE) or serial advanced technology attachment (SATA) interface. Image processor 552 performs image processing operations, such as pattern matching, image analysis to locate characters and other markings, and so forth. Bar code reader interface 554 performs communications with a bar code reader to read a lot number from a travel sheet.

An operating system runs on processing unit 502 and coordinates and provides control of various components. The operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on tape reeler inspection system 500 (Java is a trademark of Sun Microsystems, Inc. in the United States, other countries, or both).

Instructions for the operating system, the object-oriented programming system, and applications or programs are located on storage devices, such as HDD 526, and may be loaded into main memory 504 for execution by processing unit 502. The processes for embodiments of the present invention are performed by processing unit 502 using computer usable program code, which may be located in a memory such as, for example, main memory 504, ROM 524, or in one or more peripheral devices, such disk 526.

Those of ordinary skill in the art will appreciate that the hardware in FIG. 5 may vary depending on the implementation. Other internal hardware or peripheral devices, such as flash memory, equivalent non-volatile memory, or optical disk drives and the like, may be used in addition to or in place of the hardware depicted in FIG. 5. Also, the processes of the present invention may be applied to a multiprocessor data processing system.

FIG. 6 illustrates an example of a travel sheet in accordance with exemplary aspects of the present invention. Travel sheet 600 includes a history for a particular device lot. In the depicted example, travel sheet 600 includes lot number 604. Travel sheet 600 also includes bar code 602, which may simply be a bar coded version of lot number 604.

Inspection system 430 in FIG. 4 may include bar code reader 437 to read bar code 602. After inspection station 430 reads the bar code, inspection station 430 communicates with factory mainframe 442 via network 440 to obtain device lot information, as described above. Bar code 602 provides an automated manner in which the device lot identifier may be entered, thus further reducing the possibility for human error.

FIGS. 7A and 7B illustrate an example of a package information file created by engineers and maintained by the engineers and customers in accordance with exemplary aspects of the present invention. More particularly, FIGS. 7A-1 and 7A-2 show a portion of a package information file that includes a detailed format explanation. Specifically, the package information describes the manner in which the markings on each device are formatted. In the depicted example, the format description defines package name, number of pins, format of text that may be found on the first line of markings, format of text that may be found on the second line of markings, format of a first company logo, orientation of the markings, and whether to perform OCR on a line, etc.

FIG. 7B shows a portion of a package information file that includes marking information for various example devices. In the depicted example, markings for a device include a package name, number of pins, and one or more lines of text. Markings also may include more than two lines of text and one or more company logos.

Different semiconductor device manufacturers may have different formats for device markings. Therefore, the tape reeler inspection system combines device lot information and package information to form device marking information for identifying device markings. Given the content and orientation of each line of markings, as well as the presence and orientation of any company logos, the tape reeler inspection system may use OCR to recognize the content of actual device markings and compare the recognized content to what is expected based on the device marking information.

FIG. 8 illustrates an example of a device lot information file in accordance with exemplary aspects of the present invention. The device lot information file 800 includes information for one or more device lots as received from a factory mainframe. The device file name may then be used to obtain the specific markings information from the package information file described above. FIG. 9 depicts an example of device marking information that is generated based on the lot information file and the package information file in accordance with exemplary aspects of the present invention.

FIGS. 10A and 10B illustrate examples of images captured by a camera of a tape reeler inspection system in accordance with exemplary aspects of the present invention. More particularly, with reference to FIG. 10A, image 1000 is an image of a device placed in a pocket of the tape. Turning to FIG. 10B, image 1010 is an image of the device with OCR recognition. Line 1 and line 2 1012 of the markings are recognized. Recognized lines of markings 1012 may then be compared to device marking information to determine if the device is correct for the current device lot.

FIGS. 11A-11H illustrate example display screens for a graphical user interface of a tape reeler inspection system in accordance with exemplary aspects of the present invention. More particularly, with reference to FIG. 11A, inspection system window 1100 includes, for example, image display portion 1102 and handler message display portion 1108. Image display portion 1102 presents the image captured by the camera of a current device being inspected.

Also included in the graphical user interface of the inspection system is current system status dialog 1104. Other than providing status information, dialog 1104 presents "Run Inspection" button 1106, which an operator may select to begin inspection. Handler message display area 1108 presents information such as whether the device passes the OCR test, for instance. In the depicted example, OCR passed because the part name on the device, 74HC08A, matches that defined in the device lot information, 74HC08A.

Figure 11A:
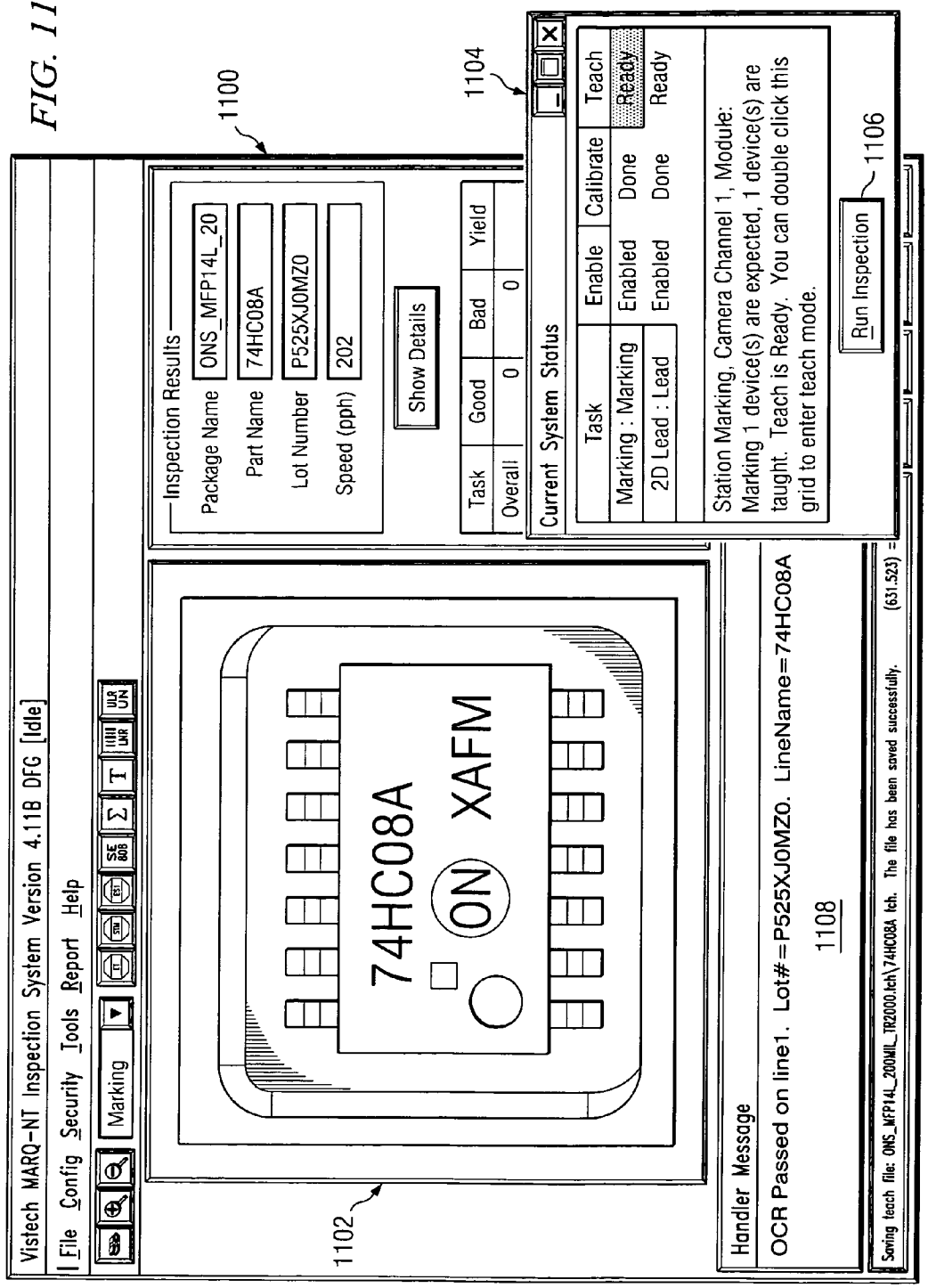
Figure 11B:
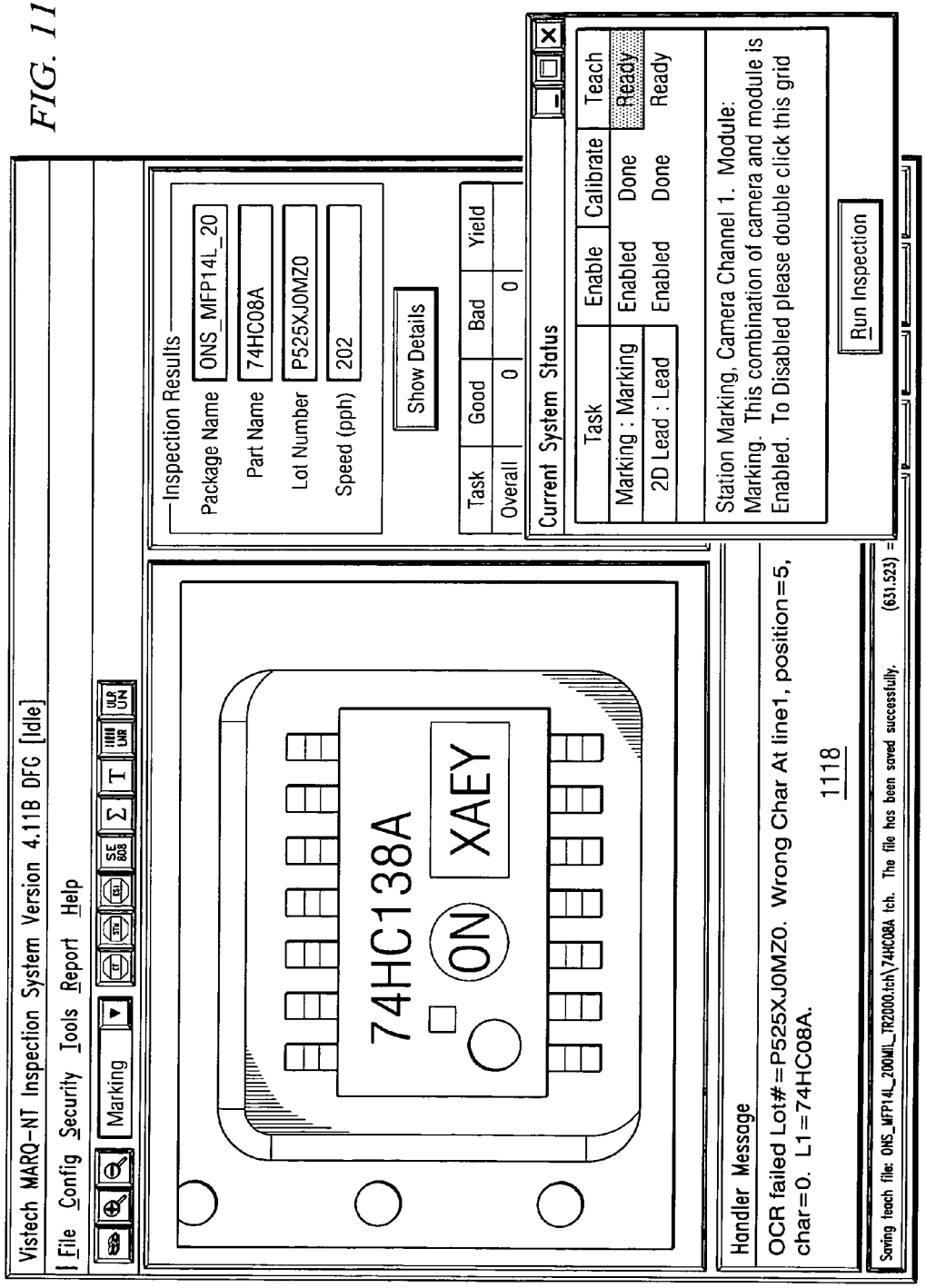

Turning to FIG. 11B, as seen in handler message portion 1118, OCR fails because the part name on the device, 74HC138A, does not match that defined in the lot information, 74HC08A.

Figure 11C:
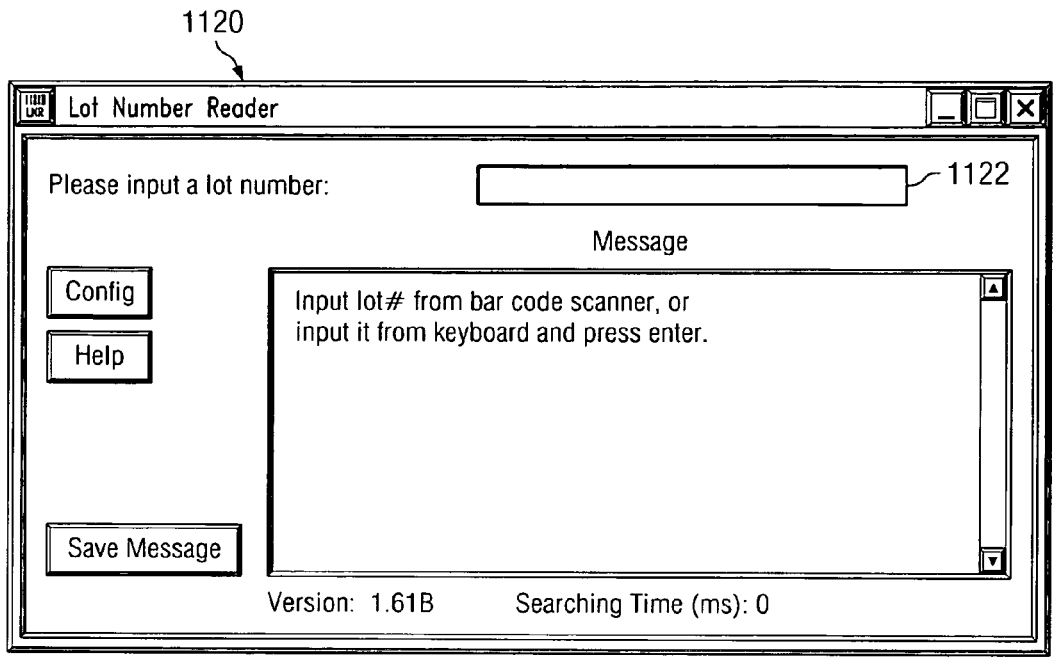
Figure 11D:
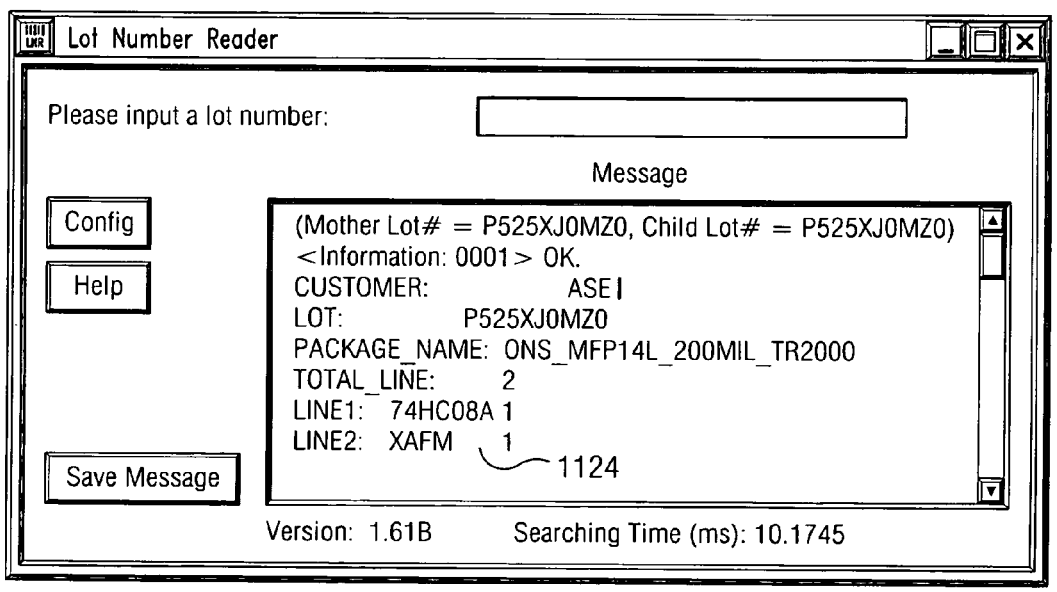

With reference to FIG. 11C, if OCR network software is installed within the tape reeler inspection system, device lot number reader dialog 1120 is displayed to prompt the operator to input the device lot number within field 1122. The device lot number may be entered into field 1122 by keyboard input, for example, or using a bar code reader. FIG. 11D illustrates dialog 1120 after the device lot number is entered and device lot information is retrieved, and marking information is formed based on lot information and package information and presented in message display area 1124.

Figure 11E:
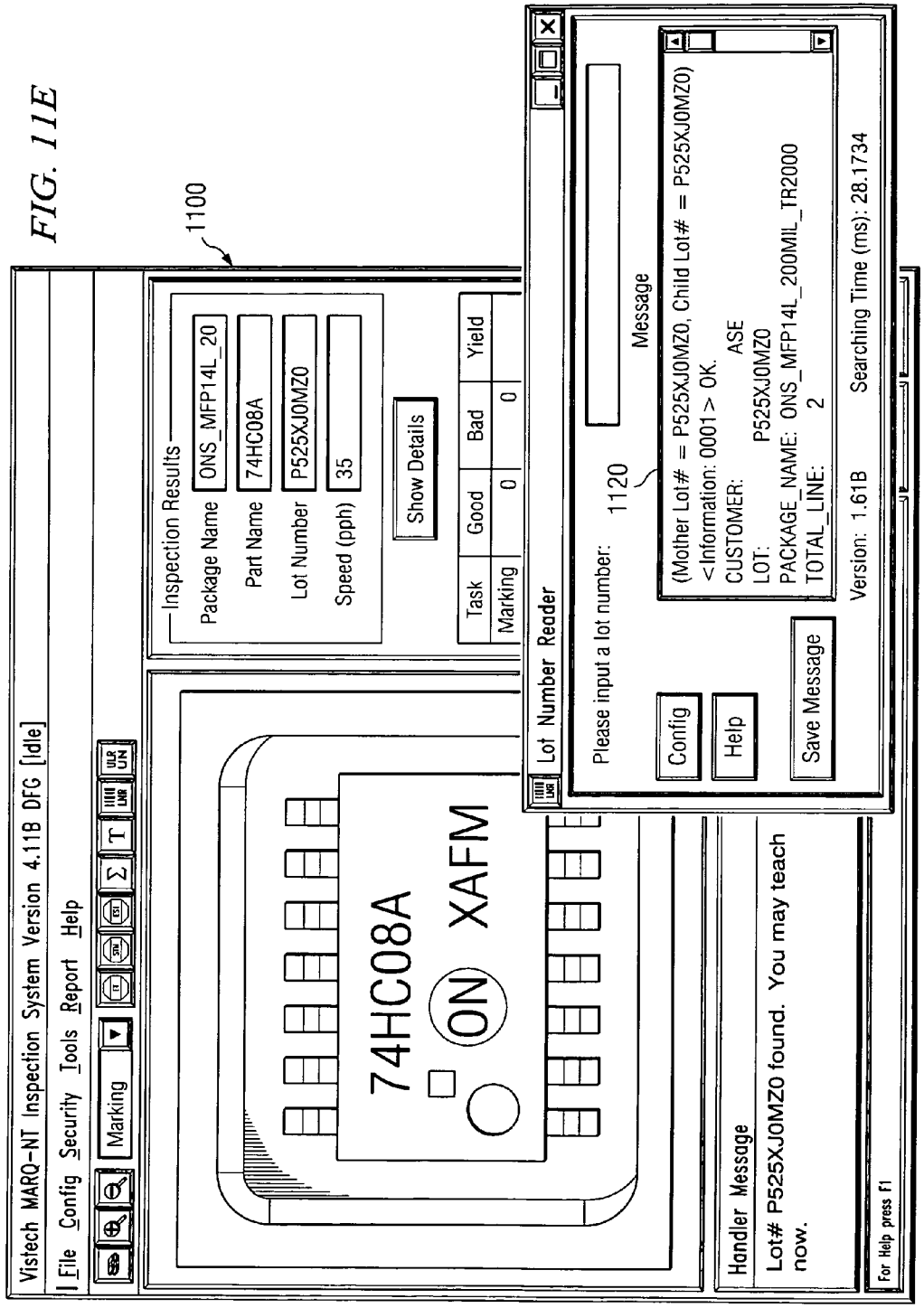

With reference now to FIG. 11E, inspection system window 1100 is presented with device lot number reader dialog 1120. In the illustrated example, device lot number reader dialog 1120 presents the formed device marking information. Next, with reference to FIG. 11F, if the tape reeler inspection system software does not include automatic teaching functionality, the operator must teach the inspection system the image of the device. However, if the tape reeler inspection system does include automatic teaching functionality, the inspection system software automatically trains the image of the device.

Figure 11F:
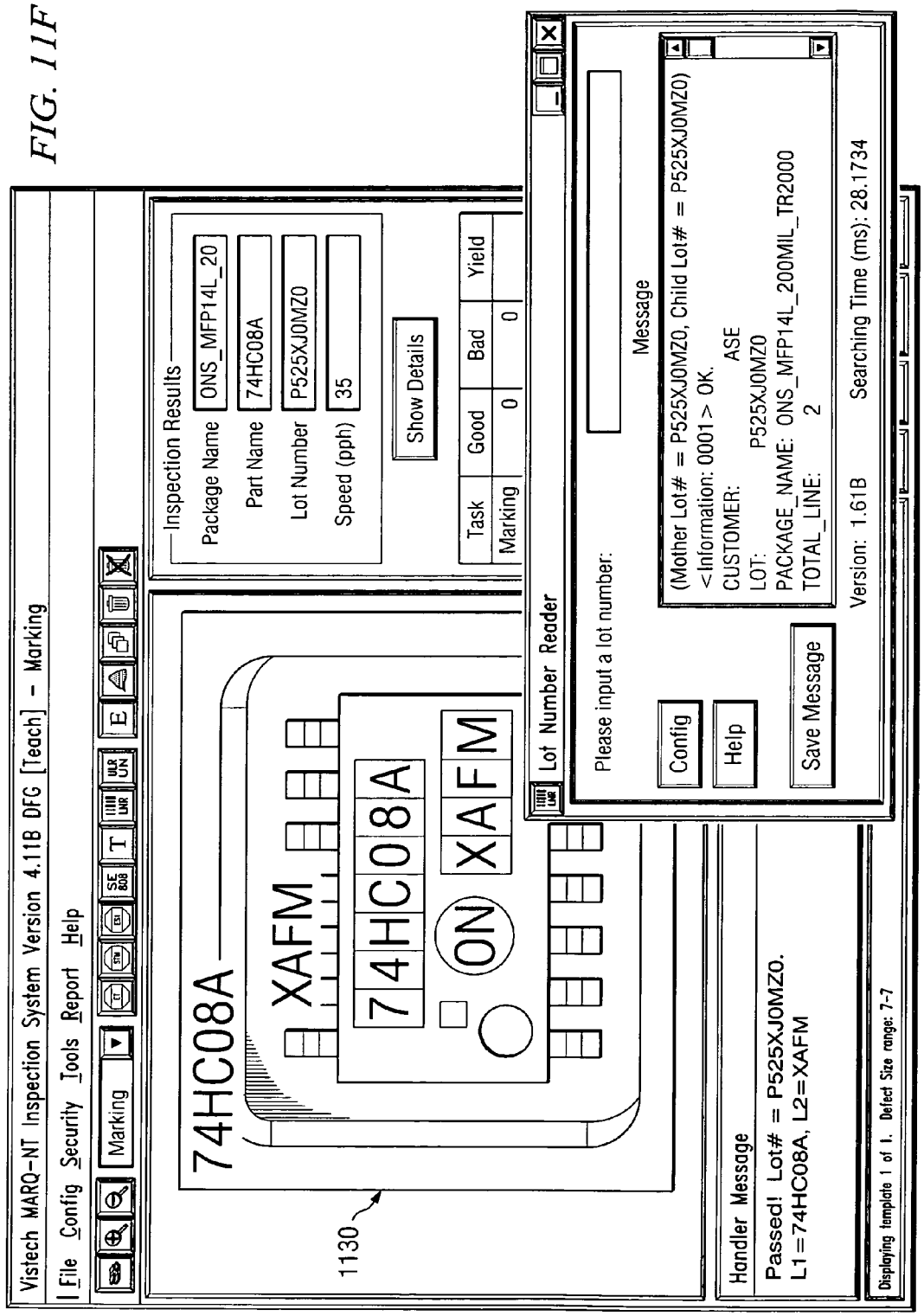
Figure 11G:
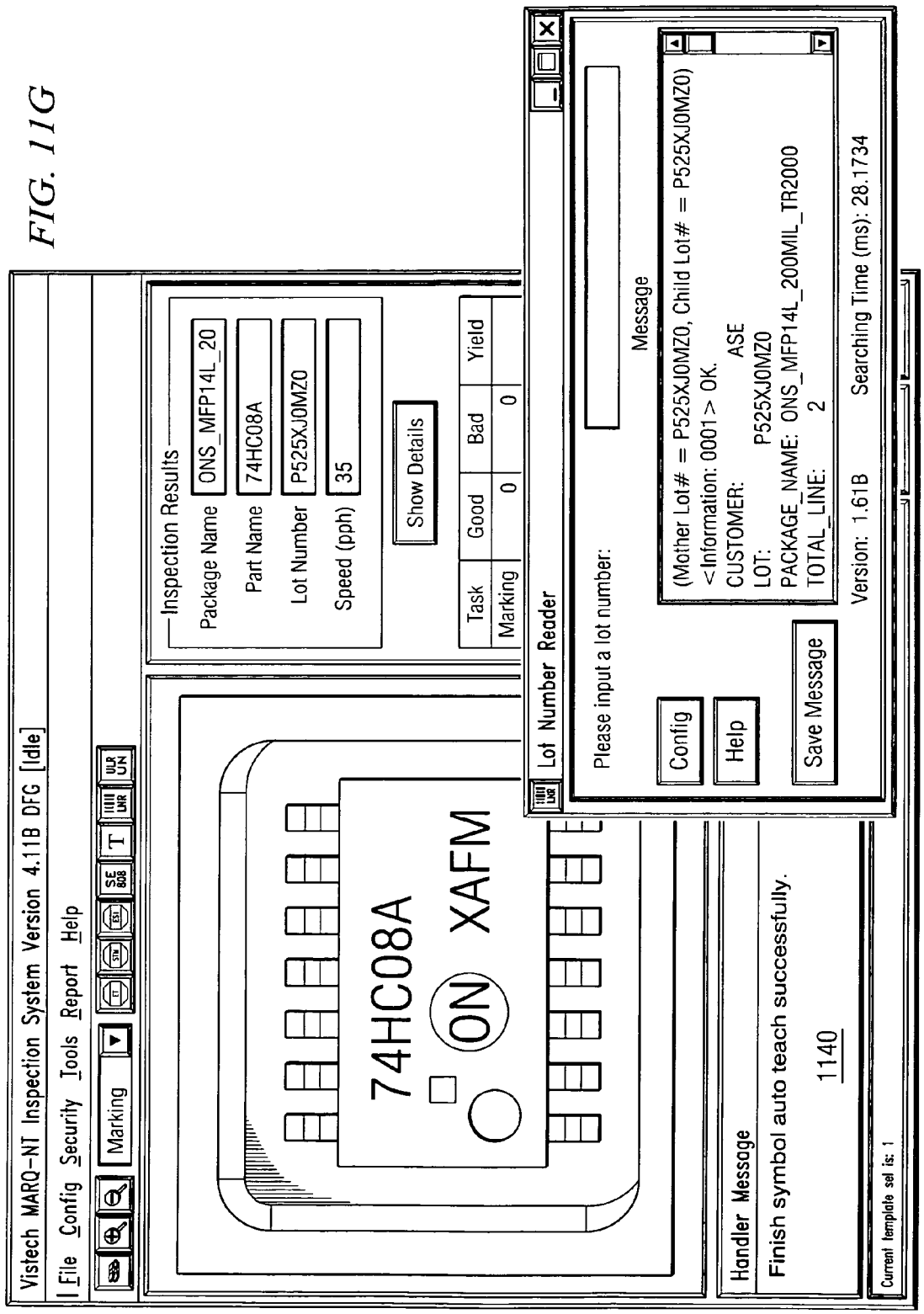

In the example depicted in FIG. 11F, the image patterns of the characters "74HC08A" and "XAFM" are automatically recognized and trained, as shown in display area 1130. When automatic teaching is finished, handler message display area 1140 in FIG. 11G presents a message notifying the operator.

FIG. 11H illustrates an example of automatic teaching of image patterns with multiple templates. Template selection dialog 1150 allows an operator to select a template to use to automatically train the image patterns for image test.

Figure 12:
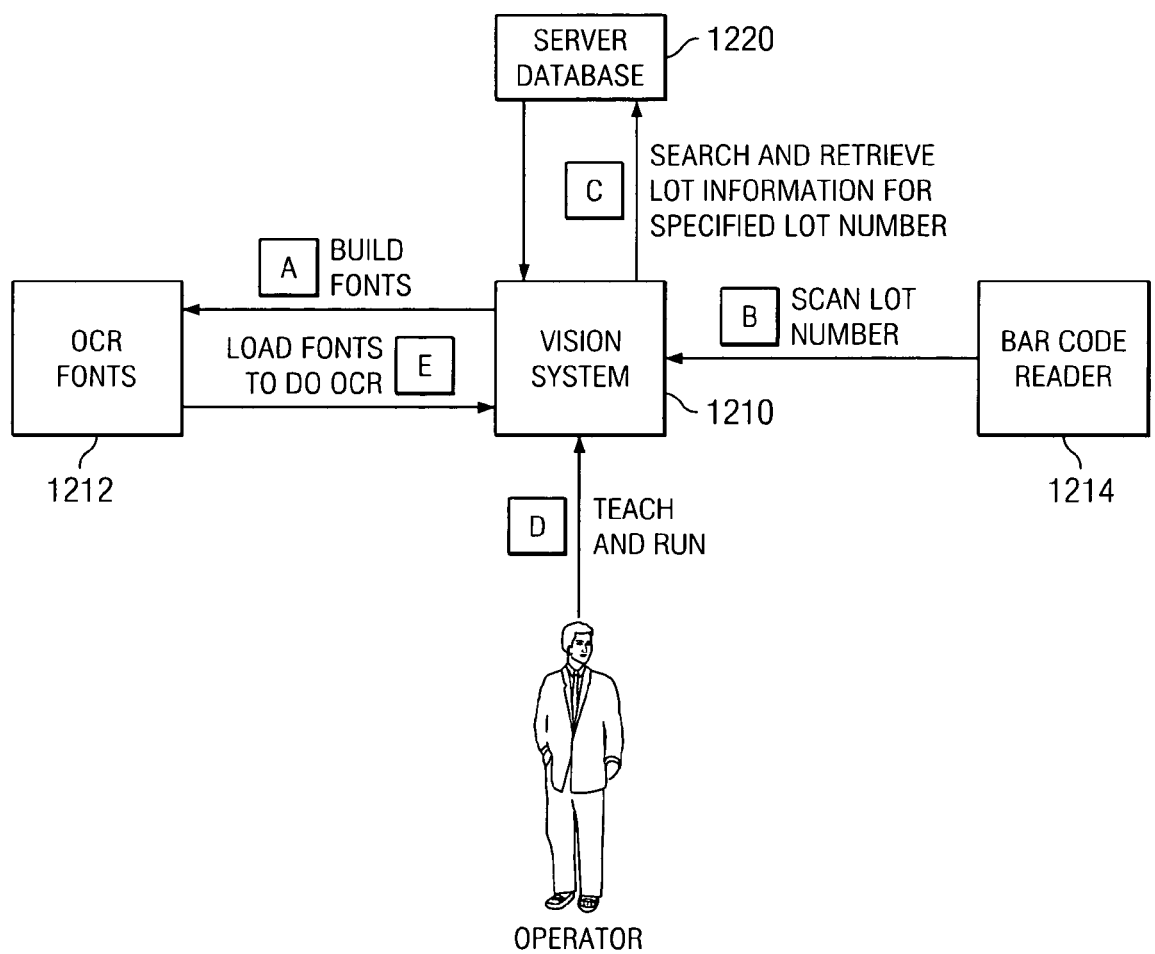
FIG. 12 is a block diagram illustrating operational flow of components of a tape reeler inspection system in accordance with exemplary aspects of the present invention.

FIG. 12 is a block diagram illustrating operational flow of components of a tape reeler inspection system in accordance with exemplary aspects of the present invention. In step A, the engineer builds fonts in OCR fonts 1212. The engineer must build the fonts only one time.

Next, in step B, the operator scans the lot sheet using bar code reader 1214. Then, in step C, vision system 1210 searches and retrieves lot information for the specified lot number from server database 1220. Thereafter, in step D, the operator teaches vision system 1210 and runs the inspection. During the inspection, vision system 1210 loads fonts from OCR fonts 1212 in step E to perform OCR testing.

Figure 13:
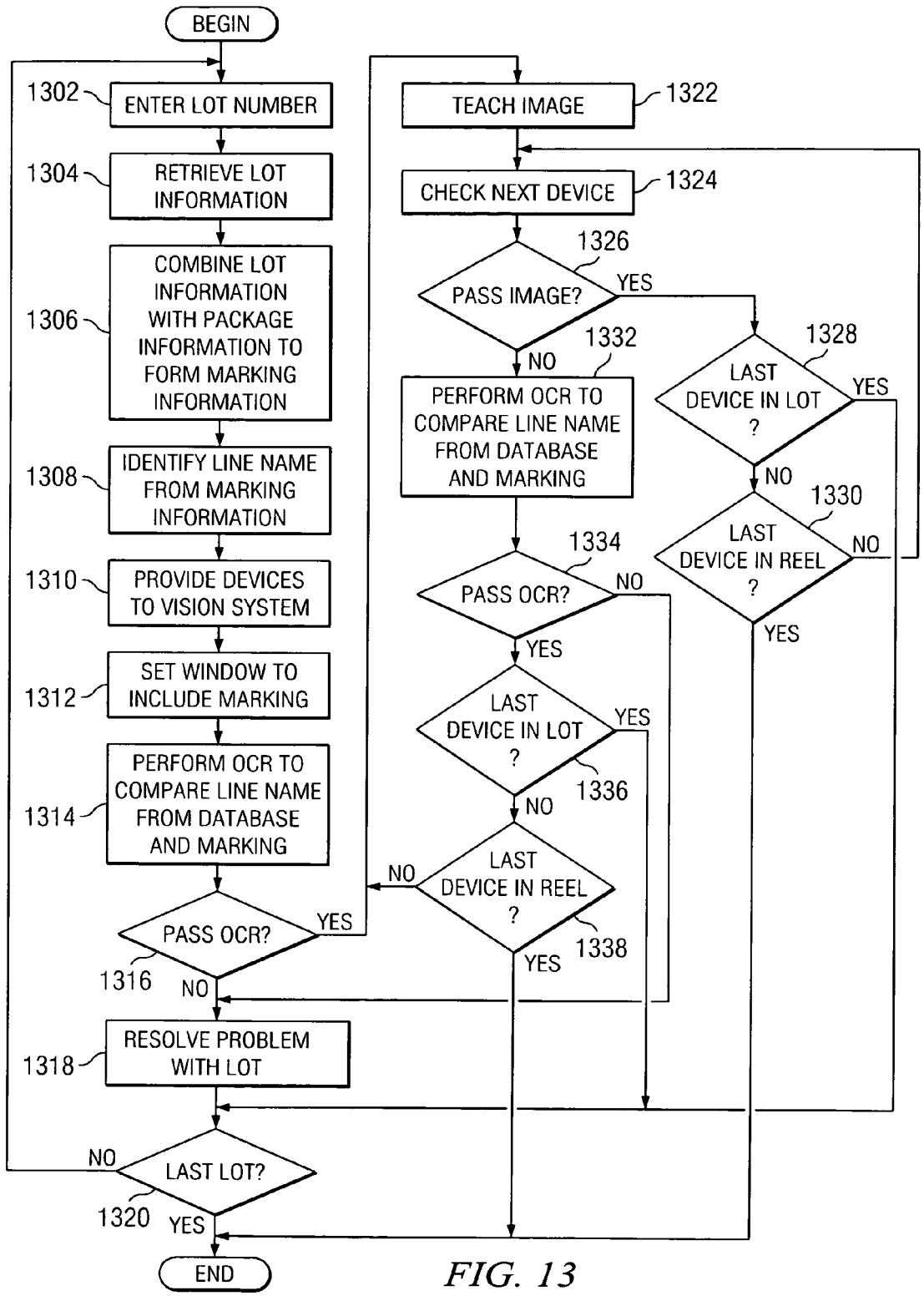
FIG. 13 is a flowchart illustrating operation of a tape reeler inspection system in accordance with an exemplary embodiment of the present invention.
Figure 15:
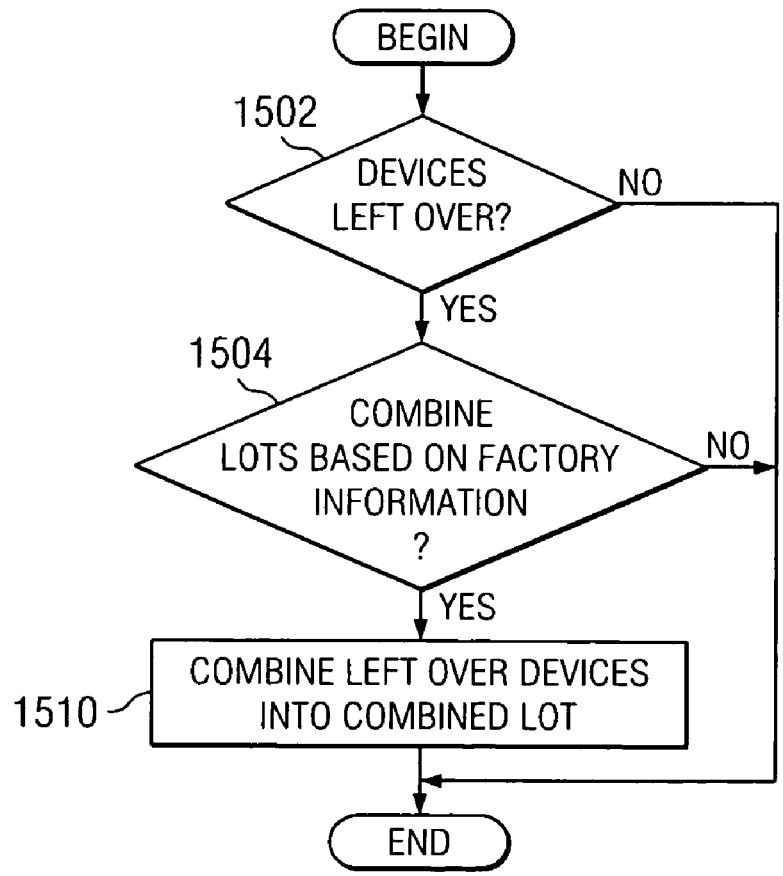
FIG. 15 is a flowchart illustrating the operation of a tape reeler inspection system for combining device lots in accordance with an exemplary embodiment of the present invention.

FIG. 13 is a flowchart illustrating operation of a tape reeler inspection system in accordance with an exemplary embodiment of the present invention. FIG. 15, to be described later, is a flowchart illustrating the operation of a tape reeler inspection system for combining device lots in accordance with an exemplary embodiment of the present invention. It will be understood that each block of the flowchart illustrations, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and computer usable program code for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

With particular reference to FIG. 13, operation begins and an operator enters the device lot number (block 1302). The operator may enter the device lot number using a keyboard, keypad, or bar code scanner.

Next, the tape reeler inspection system retrieves device lot information for the entered device lot number (block 1304) and combines the device lot information with the package information to form marking information (block 1306). The tape reeler inspection system identifies a line name from the device marking information (block 1308).

An operator provides devices to the tape reeler inspection system (block 1310) and sets a window to include the marking on the first device (block 1312). Thereafter, the tape reeler inspection system performs OCR to compare the line name from the formed device marking information and the marking on the first device (block 1314). The tape reeler inspection system determines whether the device passes the OCR test (block 1316).

The OCR test in block 1316 may, in one exemplary embodiment, include a combined lot rule. When providing devices to the vision system in block 1310, it is determined whether the reel may contain devices from a plurality of lots. Assuming the lots are the same functional device, this is referred to as a combined lot. At this time, the inspection system may accept a combine lot rule (step not shown in flowchart for simplicity), which defines whether the inspection system may accept a new device with the same device name as the previous lot. The device name includes indicia that identify the device. The date code or other markings may include indicia that identify the date of manufacture and/or the location of the manufacture, for example. Thus, the combined lot rule may allow the inspection system to accept devices from a plurality of lots as long as the devices have the same device name, hence are functionally the same. The devices in a combined lot must have the same device name. They may have different date codes or other markings.

If the device fails the OCR test, the operator attempts to resolve the problem with the current lot (block 1318). The operator determines whether the current lot is the last lot to transfer to tape and reel (block 1320). If the current lot is not the last lot, operation returns to block 1302 to enter the next lot number. In this way, the operator may continue to add another device lot to the reel to form a combined lot. If, however, the last lot is the last lot in block 1320, operation ends.

Returning to block 1316, if the device passes the OCR test, including any existing combined lot rules, the operator teaches the tape reeler inspection system the image (block 1322). Alternatively, in block 1322, the tape reeler inspection system may automatically teach the image using image analysis techniques. Next, the tape reeler inspection system checks the next device (block 1324). The tape reeler inspection system determines whether the device passes the image test (block 1326).

If the device passes the image test, the tape reeler inspection system determines whether the device is the last device in the lot (block 1328). If the device is the last device in the lot, operation proceeds to block 1320 to determine whether the current lot is the last lot to be transferred to tape and reel. As described above, the operator may then continue to add another device lot to the reel, as long as the device lots are part of a combined lot. This is controlled by the combined lot rule, which is part of the OCR test of block 1316. If the device is not the last device in the lot in block 1328, then the tape reeler inspection system determines whether the device is the last device for the current reel (block 1330). If the device is not the last device for the current reel, then operation returns to block 1324 to check the next device.

Returning to block 1326, if a predetermined number of consecutive devices fail the image test, the tape reeler inspection system performs OCR to compare the line name from the formed device marking information and the markings on the device (block 1332). The tape reeler inspection system determines whether the device passes the OCR test (block 1334). Again, the OCR test may include application of a combined lot rule, as discussed above. If the device fails the OCR test, operation proceeds to block 1318 where the operator attempts to resolve the problem with the lot.

If the device passes the OCR test in block 1334, the tape reeler inspection system determines whether the device is the last device in the lot (block 1336). If the device is the last device in the lot, operation proceeds to block 1320 to determine whether the current lot is the last lot to be transferred to tape and reel. If the device is not the last device in the lot in block 1336, the tape reeler inspection system determines whether the device is the last device for the current reel (block 1338). If the device is not the last device for the current reel, then operation returns to block 1322 to teach the image of the device.

As discussed above, the tape reeler inspection station may also allow for combined lots. If a reel holds 5,000 devices, the customer will typically want 5,000 devices on the reel. However, the semiconductor device manufacturer may provide more than 5,000 devices in a device lot. The left over devices from two or more lots may be combined in a combined lot. Therefore, if the device is the last device for the current reel in block 1330 or block 1338, then the operator may use the left over devices for a combined lot, which is described in further detail below. Thereafter, operation ends.

Figure 14:
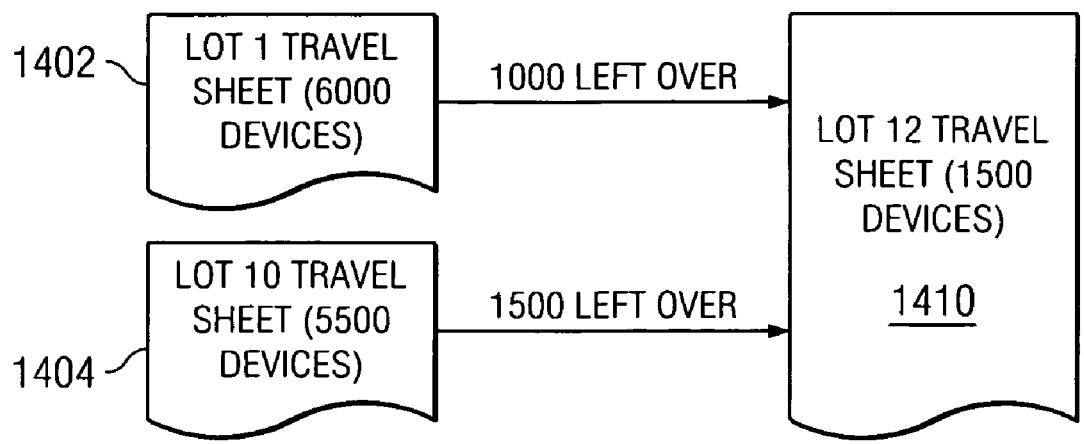
FIG. 14 illustrates a combined device lot in accordance with exemplary aspects of the present invention.

FIG. 14 illustrates a combined device lot in accordance with exemplary aspects of the present invention. Lot 1 travel has 6,000 devices. Lot 10 has 5,500 devices. Lot 1 travel sheet 1402 allows the tape reeler inspection system to retrieve device lot information, which indicates that lot 1 may be combined with other lots. Lot 10 travel sheet 1404 also allows the tape reeler inspection system to retrieve device lot information, and lot 10 also may be combined with other lots.

The tape reeler inspection system may determine from the information gathered based on lot 1 travel sheet 1402 and lot 10 travel sheet 1404 that the left over devices may be combined. The customer's factory mainframe then may generate a parent travel sheet, lot 12 travel sheet 1410 for the 1,500 left over devices. Parent travel sheet 1410 may then be used to combine the left over devices onto a reel.

With reference now to FIG. 15, operation begins and the operator determines whether devices are left over (block 1502). If devices are not left over, operation ends. If devices are left over, the tape reeler inspection system determines whether to combine lots based on factory information (block 1504). If lots cannot be combined, operation ends. If lots can be combined in block 1504, the operator combines the left over devices into a combined lot (block 1510) and operation ends.

Thus, the present invention solves the disadvantages of the prior art by providing a tape reeler inspection system with OCR testing of devices, network retrieval of device lot information, combine lot information, and package information to form device marking information, and automatic teaching of image patterns. Without OCR, the inspection system relies on a human operator to correctly train the system with a device image. With network retrieval of device lot information, the inspection system automatically gets line names from a network database or factory mainframe and package information file. With auto teaching of image patterns, the inspection system does not require a human operator to be present as long as the devices pass the OCR test.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the exemplary aspects of the present invention has been presented for purposes of illustration and description, and is not intended to be exhaustive or limited to the invention in the form disclosed. Many modifications and variations will be apparent to those of ordinary skill in the art. The exemplary embodiments were chosen and described in order to best explain the principles of the invention, the practical application, and to enable others of ordinary skill in the art to understand the invention for various embodiments with various modifications as are suited to the particular use contemplated.

What is claimed is:

1. A method for tape and reel inspection, the method comprising:
receiving an identification of a device lot, wherein the device lot comprises a plurality of devices to be packaged in a tape and reel;
performing an optical character recognition test on a first device in the plurality of devices based on device marking information associated with the identification of the device lot;
responsive to the first device passing the optical character recognition test, training an image of the first device to form a trained image; and
performing an image test on subsequent devices in the plurality of devices based on the trained image.

2. The method of claim 1, wherein receiving an identification of a device lot comprises scanning a bar code on a travel sheet of the device lot.

3. The method of claim 1, wherein performing an optical character recognition test comprises:
identifying at least one expected device name based on the device marking information;
performing optical character recognition on the first device in the plurality of devices to obtain at least one actual device name for the first device; and
comparing the at least one expected device name and the at least one actual device name,
wherein the first device passes the optical character recognition test if the at least one expected device name matches the at least one actual device name.

4. The method of claim 1, wherein training an image of the first device comprises automatically training an image pattern of the first device.

5. The method of claim 4, wherein the image pattern is automatically trained using a template and wherein the template is selected by an operator from a plurality of templates.

6. The method of claim 1, further comprising:
responsive to a subsequent device failing the image test, performing the optical character recognition test on the subsequent device;
responsive to the subsequent device passing the optical character recognition test, retraining an image of the subsequent device to form a retrained image; and
performing the image test on remaining devices in the plurality of devices based on the retrained image or a previously trained image.

7. The method of claim 6, wherein performing the optical character recognition test on the subsequent device comprises applying a combined lot rule to the subsequent device.

8. The method of claim 7, wherein the combined lot rule is specified by a customer.

9. The method of claim 1, further comprising:
retrieving device lot information from a factory database.

10. The method of claim 9, further comprising:
retrieving package information that describes a manner in which markings on each device are formatted; and
combining the device lot information and the package information to form the device marking information for the device lot.

11. A tape and reel inspection station, comprising:
a picking/placing mechanism that receives a plurality of devices and places the plurality of devices on a tape and reel;
a camera that receives an image of each device being placed on the tape and reel; and
an inspection system operatively coupled to the picking/placing mechanism and the camera, wherein the inspection system is configured to receive an identification of a device lot, wherein the device lot comprises the plurality of devices to be packaged in the tape and reel; perform an optical character recognition test on a first device in the plurality of devices based on device marking information that is associated with the identification of the device lot; train an image of the first device received from the camera to form a trained image responsive to the first device passing the optical character recognition test; and, perform an image test on subsequent devices in the plurality of devices based on the trained image.

12. The tape and reel inspection station of claim 11, further comprising:
a bar code reader,
wherein the inspection system is configured to receive an identification of a device lot by scanning a bar code on a travel sheet of the device lot using the bar code reader.

13. The tape and reel inspection station of claim 11, wherein the inspection system is configured to identify at least one expected device name based on the device marking information, perform optical character recognition on the first device in the plurality of devices to obtain at least one actual device name for the first device, and compare the at least one expected device name and the at least one actual device name, wherein the first device passes the optical character recognition test if the at least one expected device name matches the at least one actual device name.

14. The tape and reel inspection station of claim 11, wherein the inspection system is configured to perform image analysis to automatically train an image pattern of the first device.

15. The tape and reel inspection station of claim 14, wherein the inspection system is configured to automatically train the image pattern using a template and wherein the template is selected by an operator from a plurality of templates.

16. The tape and reel inspection station of claim 11, wherein the inspection system is configured to perform the optical character recognition test on a subsequent device responsive to the subsequent device failing the image test, retrain an image of the subsequent device to form a retrained image responsive to the subsequent device passing the optical character recognition test, and perform the image test on remaining devices in the plurality of devices based on the retrained image or a previously trained image.

17. The tape and reel inspection station of claim 16, wherein the inspection system is configured to apply a combined lot rule to the subsequent device.

18. The tape and reel inspection station of claim 17, wherein the combined lot rule is specified by a customer.

19. The tape and reel inspection station of claim 11, further comprising:
a communications medium,
wherein the inspection system is operatively coupled to the communications medium and wherein the inspection system is configured to retrieve device lot information from a factory database via the communications medium.

20. The tape and reel inspection station of claim 19, wherein the inspection system is configured to retrieve package information that describes a manner in which markings on each device are formatted and combine the device lot information and the package information to form the device marking information for the device lot.

21. A computer program product for tape and reel inspection, the computer program product comprising:
a computer usable medium having computer usable program code embodied therein;
computer usable program code configured to receive an identification of a device lot, wherein the device lot comprises a plurality of devices to be packaged in a tape and reel;
computer usable program code configured to perform an optical character recognition test on a first device in the plurality of devices based on device marking information associated with the identification of the device lot;
computer usable program code configured to train an image of the first device to form a trained image responsive to the first device passing the optical character recognition test; and
computer usable program code configured to perform an image test on subsequent devices in the plurality of devices based on the trained image.

22. The computer program product of claim 21, wherein the computer usable program code configured to receive an identification of a device lot comprises computer usable program code configured to scan a bar code on a travel sheet of the device lot.

23. The computer program product of claim 21, wherein the computer usable program code configured to perform an optical character recognition test comprises:
computer usable program code configured to identify at least one expected device name based on the device marking information;
computer usable program code configured to perform optical character recognition on the first device in the plurality of devices to obtain at least one actual device name for the first device; and
computer usable program code configured to compare the at least one expected device name and the at least one actual device name,
wherein the first device passes the optical character recognition test if the at least one expected device name matches the at least one actual device name.

24. The computer program product of claim 21, wherein the computer usable program code configured to train an image of the first device comprises computer usable program code configured to automatically train an image pattern of the first device.

25. The computer program product of claim 24, wherein the image pattern is automatically trained using a template and wherein the template is selected by an operator from a plurality of templates.

26. The computer program product of claim 21, further comprising:
computer usable program code configured to perform the optical character recognition test on a subsequent device responsive to the subsequent device failing the image test;
computer usable program code configured to retrain an image of the subsequent device to form a retrained image responsive to the subsequent device passing the optical character recognition test; and
computer usable program code configured to perform the image test on remaining devices in the plurality of devices based on the retrained image or a previously trained image.

27. The computer program product of claim 26, wherein the computer usable program code configured to perform the optical character recognition test on the subsequent device comprises computer usable program code configured to apply a combined lot rule to the subsequent device.

28. The computer program product of claim 27, wherein the combined lot rule is specified by a customer.

29. The computer program product of claim 21, further comprising computer usable program code configured to retrieve device lot information from a factory database.

30. The computer program product of claim 29, further comprising:

computer usable program code configured to retrieve package information that describes a manner in which markings on each device are formatted; and computer usable program code configured to combine the device lot information and the package information to form the device marking information for the device lot.

* * * * *